(12) United States Patent
Wu et al.

(10) Patent No.: US 11,758,832 B2
(45) Date of Patent: Sep. 12, 2023

(54) METHOD OF MANUFACTURING RESISTIVE RANDOM ACCESS MEMORY

(71) Applicant: Winbond Electronics Corp., Taichung (TW)

(72) Inventors: Bo-Lun Wu, Taichung (TW); Po-Yen Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 161 days.

(21) Appl. No.: 17/543,732

(22) Filed: Dec. 7, 2021

(65) Prior Publication Data
US 2022/0093859 A1    Mar. 24, 2022

Related U.S. Application Data

(62) Division of application No. 17/016,305, filed on Sep. 9, 2020, now Pat. No. 11,239,417.

(51) Int. Cl.
*H10N 70/00* (2023.01)
*H10N 70/20* (2023.01)

(52) U.S. Cl.
CPC ....... *H10N 70/8416* (2023.02); *H10N 70/023* (2023.02); *H10N 70/24* (2023.02); *H10N 70/826* (2023.02); *H10N 70/828* (2023.02); *H10N 70/8833* (2023.02)

(58) Field of Classification Search
CPC .. H10N 70/8416; H10N 70/023; H10N 70/24; H10N 70/826; H10N 70/828; H10N 70/8833
See application file for complete search history.

(56) References Cited

U.S. PATENT DOCUMENTS

2020/0373487 A1* 11/2020 Wang ............... H10N 70/20

* cited by examiner

*Primary Examiner* — Shih Tsun A Chou
(74) *Attorney, Agent, or Firm* — JCIPRNET

(57) ABSTRACT

Provided is a method of manufacturing a resistive random access memory (RRAM) including: forming a lower electrode protruding from a top surface of a dielectric layer; conformally forming a data storage layer on the lower electrode and the dielectric layer; forming an oxygen reservoir material layer on the data storage layer; forming an opening in the oxygen reservoir material layer to expose the data storage layer on the lower electrode; forming an isolation structure in the opening, wherein the isolation structure divides the oxygen reservoir material layer into a first oxygen reservoir layer and a second oxygen reservoir layer; and forming an upper electrode on the first and second oxygen reservoir layers, wherein the first and second oxygen reservoir layers share the upper electrode.

10 Claims, 7 Drawing Sheets

METHOD OF MANUFACTURING RESISTIVE RANDOM ACCESS MEMORY

CROSS-REFERENCE TO RELATED APPLICATION

This is a divisional application of and claims the priority benefit of U.S. application Ser. No. 17/016,305, filed on Sep. 9, 2020, now allowed. The entirety of the above-mentioned patent application is hereby incorporated by reference herein and made a part of this specification.

BACKGROUND OF THE INVENTION

Field of the Invention

The present invention relates to a resistive random access memory and and a method of manufacturing the same.

Description of Related Art

In recent years, the development of the Resistive Random Access Memory (RRAM) is extremely rapid, and it is currently the most anticipated structure of future memory. Since RRAM has the potential advantages of low power consumption, high speed operation, high density and compatibility with Complementary Metal Oxide Semiconductor (CMOS) process technology, it is very suitable for the next generation of non-volatile memory devices.

Current RRAM requires a thicker transition metal oxide (TMO) layer to improve the high-temperature data retention (HTDR). However, when patterning an excessively thick TMO layer, the sidewalls of the TMO layer may be damaged, so that subsequent operation of RRAM may be failed. In addition, the excessively thick TMO layer also results in additional reliability issues during the forming operation.

SUMMARY OF THE INVENTION

The invention provides a resistive random access memory (RRAM) and a method of manufacturing the same, which can increase the current gain while keep the data storage layer at a certain thickness, thereby improving the performance of the memory.

The invention provides a method of manufacturing a RRAM including: conformally forming a data storage layer on the lower electrode and the dielectric layer; forming an oxygen reservoir material layer on the data storage layer; forming an opening in the oxygen reservoir material layer to expose the data storage layer on the lower electrode; forming an isolation structure in the opening, wherein the isolation structure divides the oxygen reservoir material layer into a first oxygen reservoir layer and a second oxygen reservoir layer; and forming an upper electrode on the first and second oxygen reservoir layers, wherein the first and second oxygen reservoir layers share the upper electrode.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
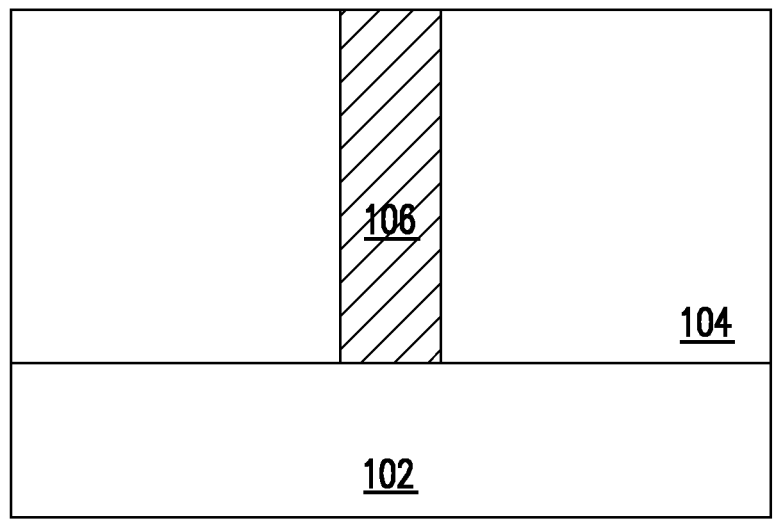
FIG. 1A to FIG. 1G are schematic cross-sectional views of a manufacturing process of a RRAM according to a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. Wherever possible, the same or similar reference numbers are used in the drawings and the description to refer to the same or similar components, and are not repeated again in the following paragraphs.

FIG. 1A to FIG. 1G are schematic cross-sectional views of a manufacturing process of a RRAM according to a first embodiment of the invention.

Figure 1B:
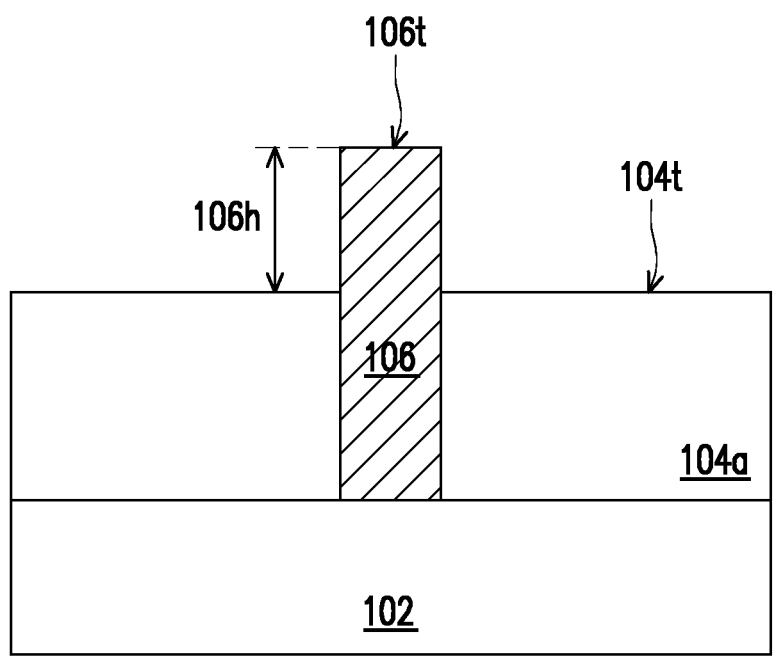
Figure 1C:
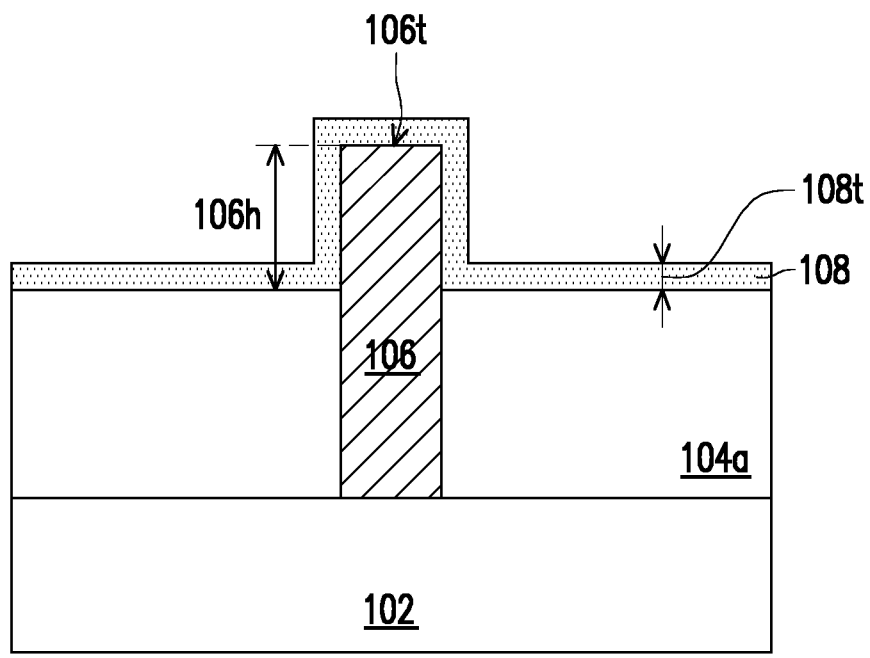
Figure 1D:
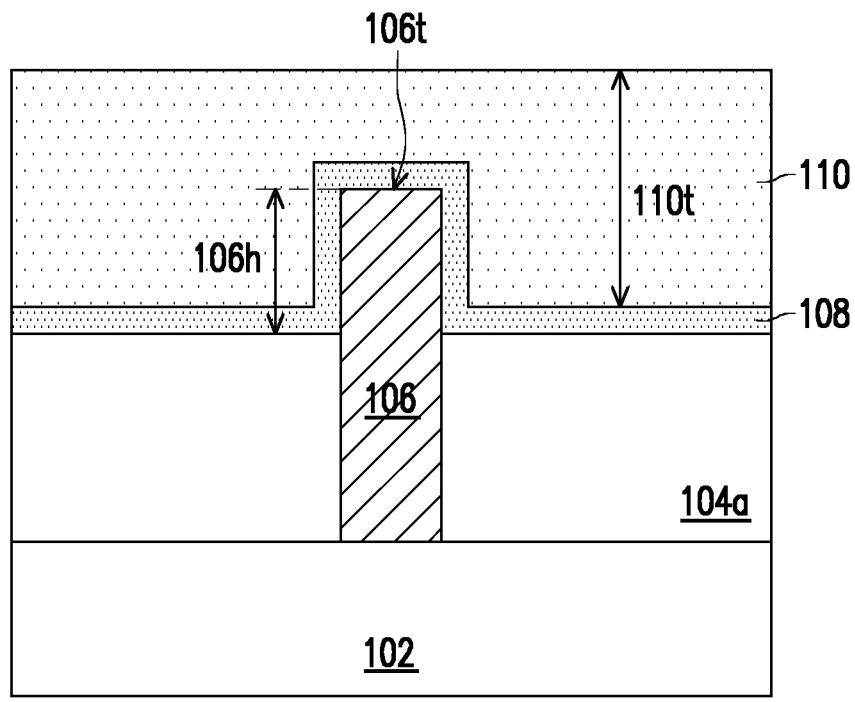
Figure 1E:
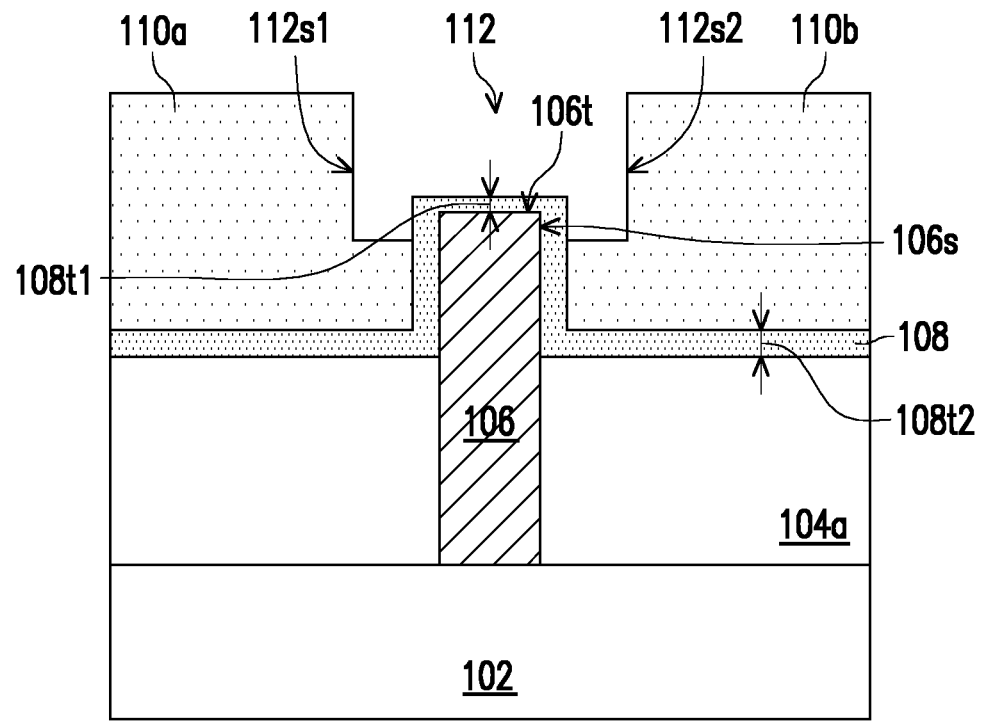
Figure 1F:
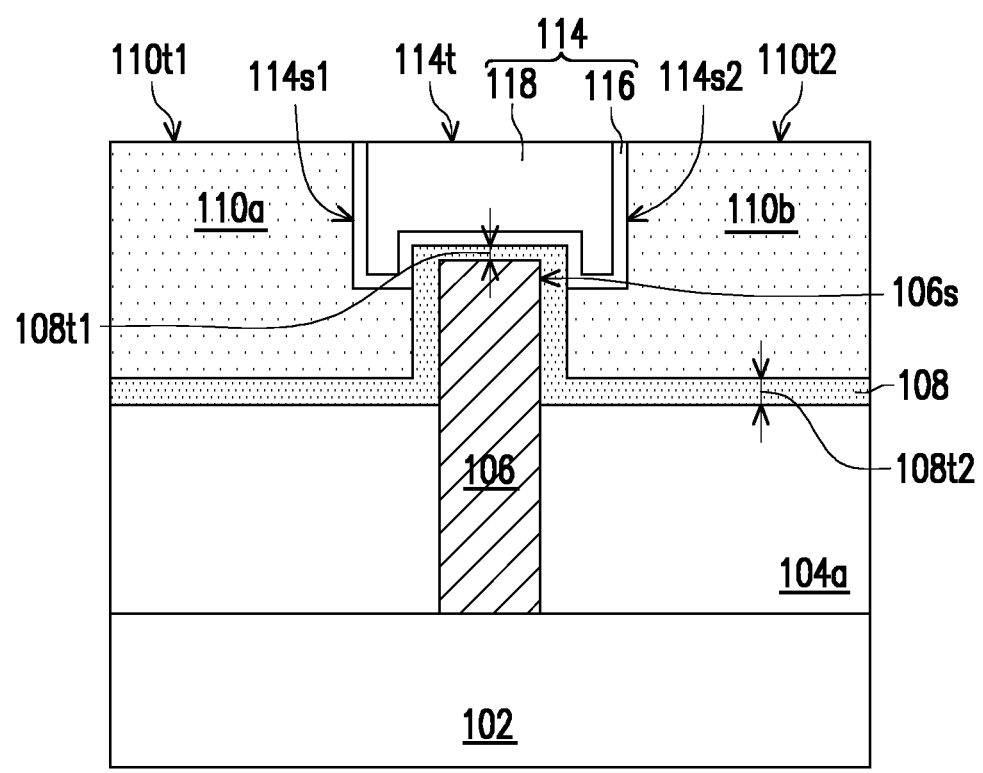
Figure 1G:
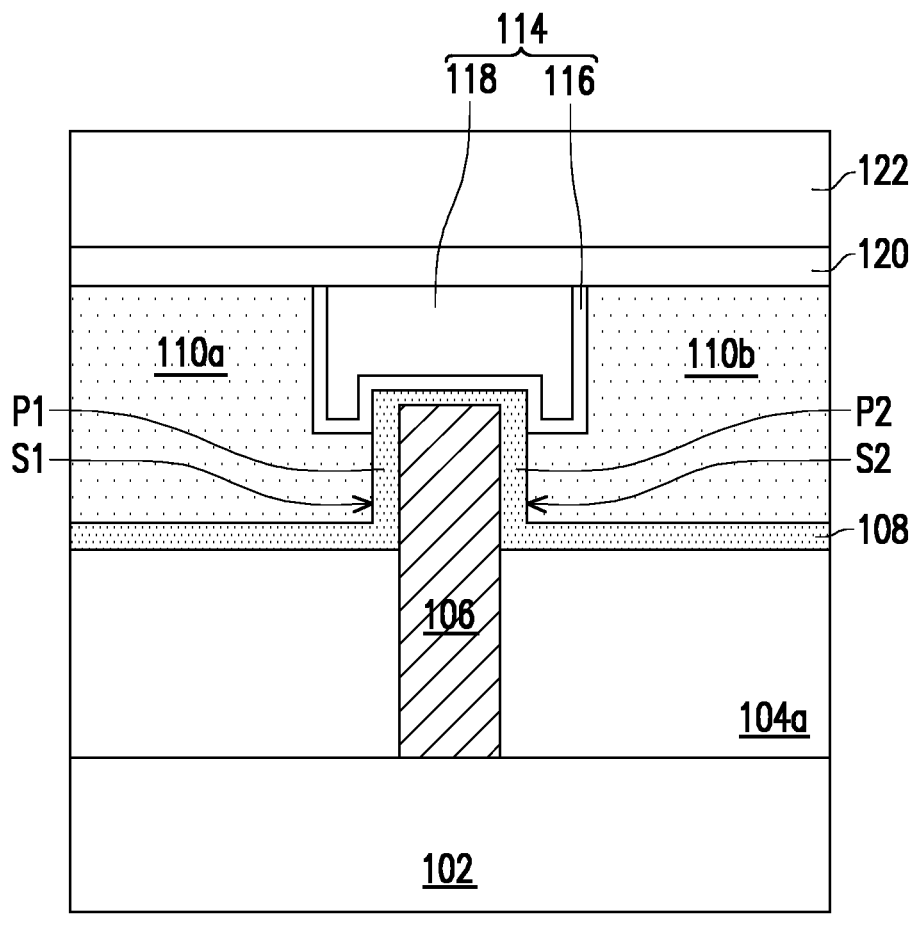

In the first embodiment of the present invention, a method of manufacturing a RRAM 100 (as shown in FIG. 1G) is provided to include the following steps. First, referring to FIG. 1A, a substrate 102 is provided. In one embodiment, the substrate 102 includes a semiconductor substrate, such as a silicon substrate. Next, a dielectric layer 104 and a lower electrode 106 are formed on the substrate 102. The lower electrode 106 is embedded in the dielectric layer 104. In one embodiment, a material of the dielectric layer 104 includes silicon oxide, silicon nitride, silicon oxynitride, or a combination thereof. A material of the lower electrode 106 includes a conductive material, which may be a metal material, a metal nitride, or other suitable conductive materials, for example. For example, the lower electrode 106 may be a TiN layer. In the embodiment, the dielectric layer 104 may be referred to as an inter-metal dielectric (IMD) layer. In the case, the lower electrode 106 may be electrically connected to the device layer (not shown) between the substrate 102 and the lower electrode 106. The device layer includes active devices, such as transistors, diodes, or the like.

Referring to FIG. 1A and FIG. 1B, an etching back process is performed to remove a portion of the dielectric layer 104, so that the lower electrode 106 protrudes from a top surface 104$t$ of the dielectric layer 104$a$. That is, the top surface 104$t$ of the dielectric layer 104$a$ is lower than a top surface 106$t$ of the lower electrode 106. In an embodiment, a height 106$h$ of the lower electrode 106 protruding from the dielectric layer 104$a$ may be 10 nm to 100 nm. The said etching back process may be a wet etching process or an isotropic etching process.

Referring to FIG. 1C, a data storage layer 108 is conformally formed on the lower electrode 106 and the dielectric layer 104$a$. In one embodiment, a material of the data storage layer 108 includes at least one oxide material selected from the group consisting of $TiO_2$, NiO, HfO, $HfO_2$, ZrO, $ZrO_2$, $Ta_2O_5$, ZnO, $WO_3$, CoO, and $Nb_2O_5$, and the data storage layer 108 may be formed by an atomic layer deposition (ALD), a chemical vapor deposition (CVD), or similar deposition methods. For example, the data storage layer 108 may be an $HfO_2$ layer, and a thickness 108$t$ of the data storage layer 108 may be 3 nm to 15 nm. However, the present invention is not limited thereto, in other embodiments, the material of the data storage layer 108 may be a variable resistance material that may change its own resistance through the applied voltage.

Referring to FIG. 1D, an oxygen reservoir material layer 110 is formed on the data storage layer 108. In an embodiment, a material of the oxygen reservoir material layer 110 may include a suitable metal material such as Ti, Ta, Hf, Zr, Al, or a combination thereof, and the oxygen reservoir material layer 110 may be formed by a physical vapor deposition (PVD). For example, the oxygen reservoir material layer 110 may be, for example, a Ti layer, and a thickness 110t of the oxygen reservoir material layer 110 may be 100 nm to 300 nm. The thickness 110t of the oxygen reservoir material layer 110 may be greater than the height 106h of the lower electrode 106 protruding from the dielectric layer 104a, so that the oxygen reservoir material layer 110 may cover the top surface 106t of the lower electrode 106. In alternative embodiments, the oxygen reservoir material layer 110 may have a greater adsorption ability or binding ability for oxygen ions than that of the data storage layer 108, so as to quickly adsorb or bind oxygen ions during the operation of memory cell, thereby forming the filament in the data storage layer 108.

Figure 2A:
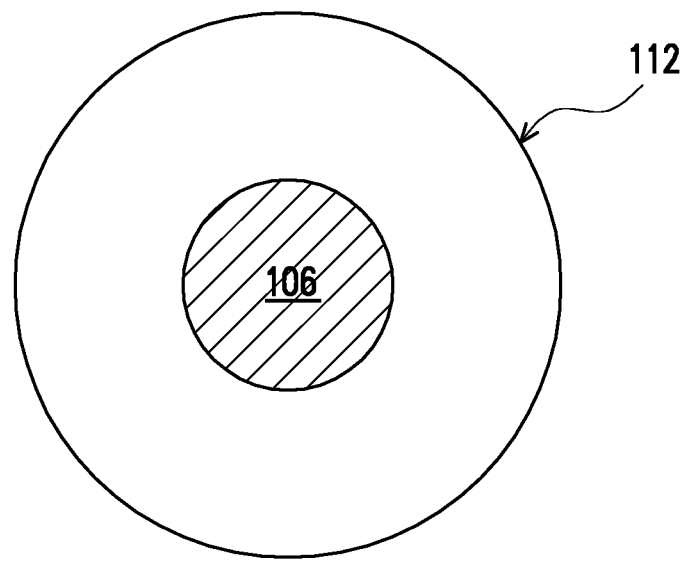
FIG. 2A and FIG. 2B are respectively schematic top views of FIG. 1E.
Figure 2B:
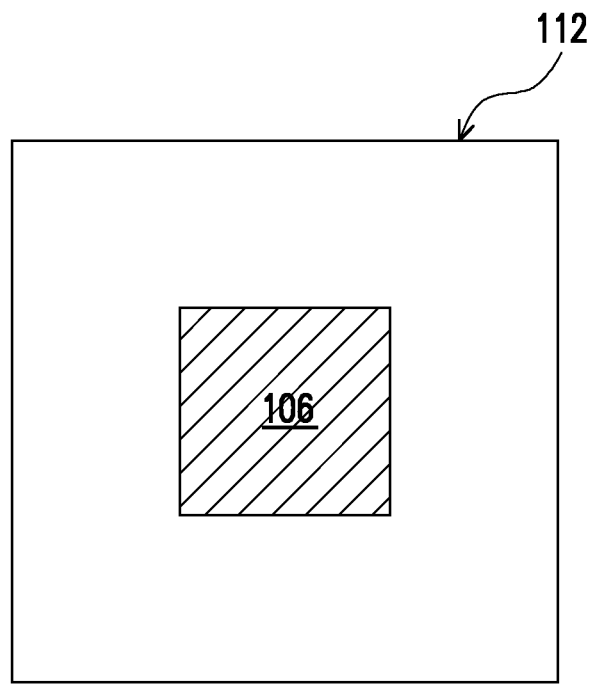

Referring to FIGS. 1D and 1E, a patterning process is performed to form an opening 112 in the oxygen reservoir material layer 110. The opening 112 exposes the data storage layer 108 that is directly above the lower electrode 106. Specifically, as shown in FIG. 1E, the opening 112 exposes not only the data storage layer 108 on the top surface 106t of the lower electrode 106, but also the data storage layer 108 on an upper sidewall 106s of the lower electrode 106. From the perspective of the top view of FIG. 2A, the lower electrode 106 may be circular, and the opening 112 may also be circular. The area of the opening 112 is greater than the area of the lower electrode 106, and the opening 112 completely covers the lower electrode 106. However, the present invention is not limited thereto, as shown in the top view of FIG. 2B, the lower electrode 106 may be rectangular or other shapes, and the opening 112 may also be rectangular or other shapes.

After forming the opening 112, the continuous oxygen reservoir material layer 110 is divided or spaced into a first oxygen reservoir layer 110a and a second oxygen reservoir layer 110b by the opening 112. The first oxygen reservoir layer 110a is located on the data storage layer 108 at a first side 112s1 of the opening 112, and the second oxygen reservoir layer 110b is located on the data storage layer 108 at a second side 112s2 of the opening 112. It should be noted that, in one embodiment, the data storage layer 108 may be regarded as the etching stop layer of the said patterning process. In the case, the data storage layer 108 exposed to the opening 112 may be consumed in the said patterning process, so that the data storage layer 108 exposed to the opening 112 has a first thickness 108t1, and the data storage layer 108 not exposed to the opening 112 has a second thickness of 108t2. In the embodiment, the first thickness 108t1 is less than the second thickness 108t2.

Referring to FIG. 1F, an isolation structure 114 is formed in the opening 112. Specifically, the isolation structure 114 may be formed by following steps: conformally forming a barrier material in the opening 112; forming an insulating material on the barrier material to fill up the opening 112 and extend to cover the first oxygen reservoir layer 110a and the second oxygen reservoir layer 110b; and performing a planarization process (e.g., a CMP process) to remove a portion of the insulating material and a portion of the barrier material, so as to expose a top surface 110t1 of the first oxygen reservoir layer 110a and a top surface 110t2 of the second oxygen reservoir layer 110b. After performing the planarization process, the isolation structure 114 includes a first barrier layer 116 and an insulating layer 118. The first barrier layer 116 conformally covers the opening 112. The insulating layer 118 is located on the first barrier layer 116 and fills up the opening 112. In the embodiment, the first barrier layer 116 may be used as an oxygen diffusion barrier layer to prevent oxygen ions from moving between the insulating layer 118 and the first oxygen reservoir layer 110a or between the insulating layer 118 and the second oxygen reservoir layer 110b. In an embodiment, a material of the first barrier layer 116 includes a suitable dielectric material such as aluminum oxide ($Al_2O_3$), silicon nitride, silicon carbide, silicon carbonitride, and a combination thereof. A thickness of the first barrier layer 116 may be 1 nm to 15 nm. A material of the insulating layer 118 includes a suitable insulating material such as silicon oxide, silicon nitride, silicon oxynitride, and a combination thereof. In addition, after performing the planarization process, a top surface 114t of the isolation structure 114 may be coplanar with the top surface 110t1 of the first oxygen reservoir layer 110a and the top surface 110t2 of the second oxygen reservoir layer 110b.

From another perspective, as shown in FIG. 1D and FIG. 1F, the isolation structure 114 divides the continuous oxygen reservoir material layer 110 into a first oxygen reservoir layer 110a and a second oxygen reservoir layer 110b. The first oxygen reservoir layer 110a is located on the data storage layer 108 at a first side 114s1 of the isolation structure 114, and the second oxygen reservoir layer 110b is located on the data storage layer 108 at a second side 114s2 of the isolation structure 114. The isolation structure 114 covers the data storage layer 108 on the top surface 106t of the lower electrode 106, and extends to cover the data storage layer 108 on the upper sidewall 106s of the lower electrode 106, as shown in FIG. 1F. In the embodiment, the data storage layer 108 covering the top surface 106t of the lower electrode 106 has the first thickness 108t1, the data storage layer 108 covering the top surface 104t of the dielectric layer 104a has the second thickness 108t2, and the first thickness 108t1 is less than the second thickness 108t2.

Referring to FIG. 1G, a second barrier layer 120 is formed on the isolation structure 114, the first oxygen reservoir layer 110a, and the second oxygen reservoir layer 110b. In an embodiment, a material of the second barrier layer 120 includes aluminum oxide, silicon nitride, silicon carbide, silicon carbonitride, a combination thereof, and other suitable dielectric materials. A thickness of the second barrier layer 120 may be 1 nm to 10 nm. The second barrier layer 120 and the first barrier layer 116 may have the same material or different materials. In the embodiment, the second barrier layer 120 may be used as an oxygen diffusion barrier layer to block oxygen ions to diffuse from the first oxygen reservoir layer 110a (or second oxygen reservoir layer 110b) into the upper electrode 122 and cannot return to the data storage layer 108 again, thereby avoid the problem of device failure.

An upper electrode 122 is then formed on the second barrier layer 120, so that the second barrier layer 120 is located between the upper electrode 122 and the isolation structure 114, between the upper electrode 122 and the first oxygen reservoir layer 110a, and between the upper electrode 122 and the second oxygen reservoir layer 110b. In an embodiment, a material of the upper electrode 122 includes a conductive material, which may be a metal material, a metal nitride, or other suitable conductive materials, for example. For example, the upper electrode 122 may be a TiN layer. In one embodiment, the upper electrode 122 and the lower metal 104 may have the same material or different materials. After forming the upper electrode 122, the RRAM 100 of the first embodiment is accomplished. The RRAM 100 may be disposed between any two metal layers in the interconnect structure, for example, between the first metal layer (M1) and the second metal layer (M2).

It should be noted that, as shown in FIG. 1G, the isolation structure 114 divides the continuous oxygen storage material layer into the first oxygen reservoir layer 110a and the second oxygen reservoir layer 110b to form a dual-channel memory cell. The first oxygen reservoir layer 110a and the second oxygen reservoir layer 110b share the continuous upper electrode 122. While keeping the data storage layer 108 at the original design thickness, the dual-channel memory cell has a greater current gain to improve the performance of the RRAM 100. In other words, in the present embodiment of the present invention, the RRAM 100 is able to obtain a better high-temperature data retention ability without increasing the thickness of the data storage layer. On the other hand, when the forming operation is performed, the data storage layer 108 with a thinner thickness has a lower forming voltage, which is advantageous for mass production and can improve the reliability of the RRAM 100.

Further, the first oxygen reservoir layer 110a is in direct contact with the data storage layer 108 on a first sidewall S1 of the lower electrode 106. Accordingly, a filament may be formed in the data storage layer 108 on the first sidewall S1 of the lower electrode 106 as a current transmission path P1. The current transmission path P1 has a lower resistance value due to the thinner data storage layer 108, thereby improving the performance of the RRAM 100. Similarly, the second oxygen reservoir layer 110b is in direct contact with the data storage layer 108 on a second sidewall S2 of the lower electrode 106. Accordingly, another filament may be formed in the data storage layer 108 on the second sidewall S2 of the lower electrode 106 as another current transmission path P2. The current transmission path P2 also has a lower resistance value due to the thinner data storage layer 108, thereby improving the performance of the RRAM 100.

Figure 3:
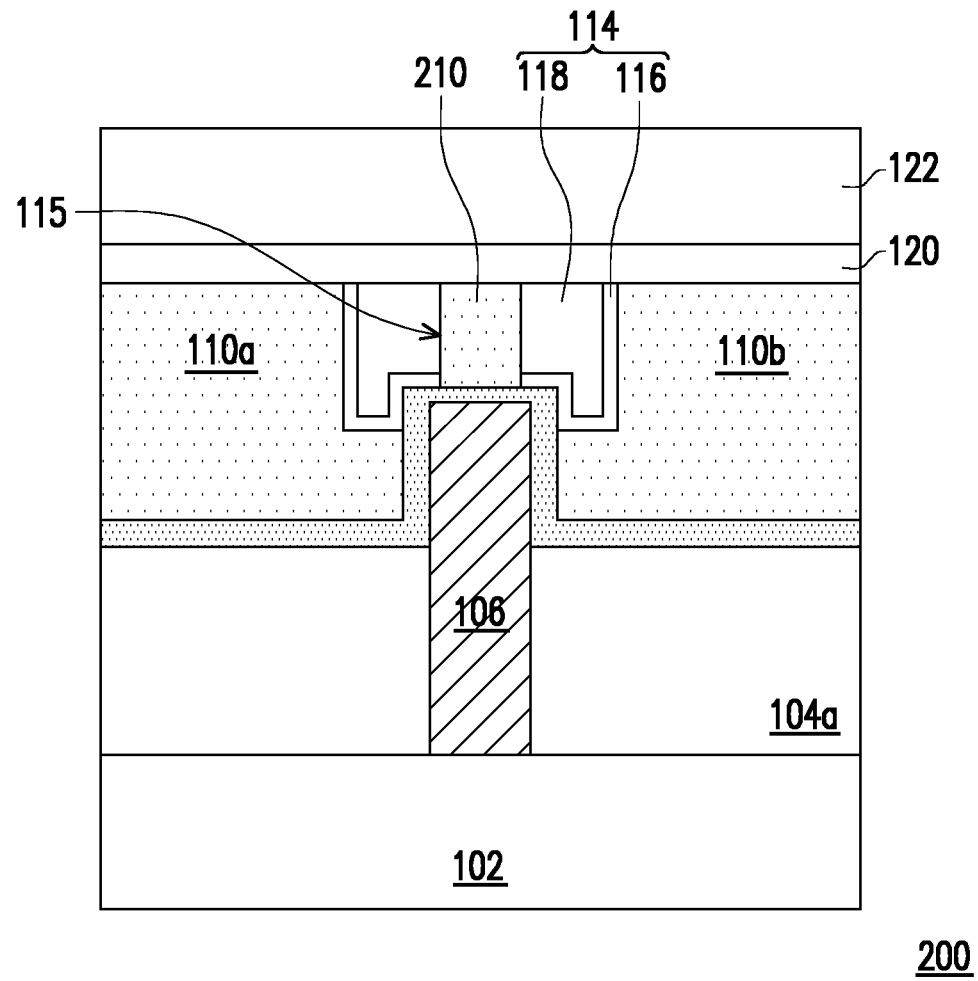
FIG. 3 is a schematic cross-sectional view of a RRAM according to a second embodiment of the invention.

FIG. 3 is a schematic cross-sectional view of a RRAM according to a second embodiment of the invention.

Referring to FIG. 3, a RRAM 200 of the second embodiment of the present invention is similar to the RRAM 100 of the first embodiment of the present invention, and the main difference is that: the RRAM 200 of the second embodiment has a third oxygen reservoir layer 210 embedded in the isolation structure 114. In one embodiment, the third oxygen reservoir layer 210 may be formed by following steps: after forming the isolation structure 114 of FIG. 1F, patterning the isolation structure 114 to form an opening 115 in the isolation structure 114; the third oxygen reservoir layer 210 is then formed in the opening 115. In the case, the third oxygen reservoir layer 210 would penetrate through the first barrier layer 116 to contact the data storage layer 108. The isolation structure 114 separates the first oxygen reservoir layer 110a, the second oxygen reservoir layer 110b, and the third oxygen reservoir layer 210. The top surface of the isolation structure 114 is coplanar with the top surface of the first oxygen reservoir layer 110a, the top surface of the second oxygen reservoir layer 110b, and the top surface of the third oxygen reservoir layer 210.

It should be noted that, in the embodiment, the isolation structure 114 divides the continuous oxygen storage material layer into the first oxygen reservoir layer 110a, the second oxygen reservoir layer 110b, and the third oxygen reservoir layer 210 to form a triple-channel memory cell. In the case, the triple-channel memory cell can have a greater current gain to further improve the performance of the RRAM 200. In addition, in the case of keeping the data storage layer 108 at the original design thickness, the present embodiment can further divide the continuous oxygen storage material layer into a multi-channel structure, so as to effectively reduce the chip usage area, thereby achieving the requirement of miniaturization.

Figure 4:
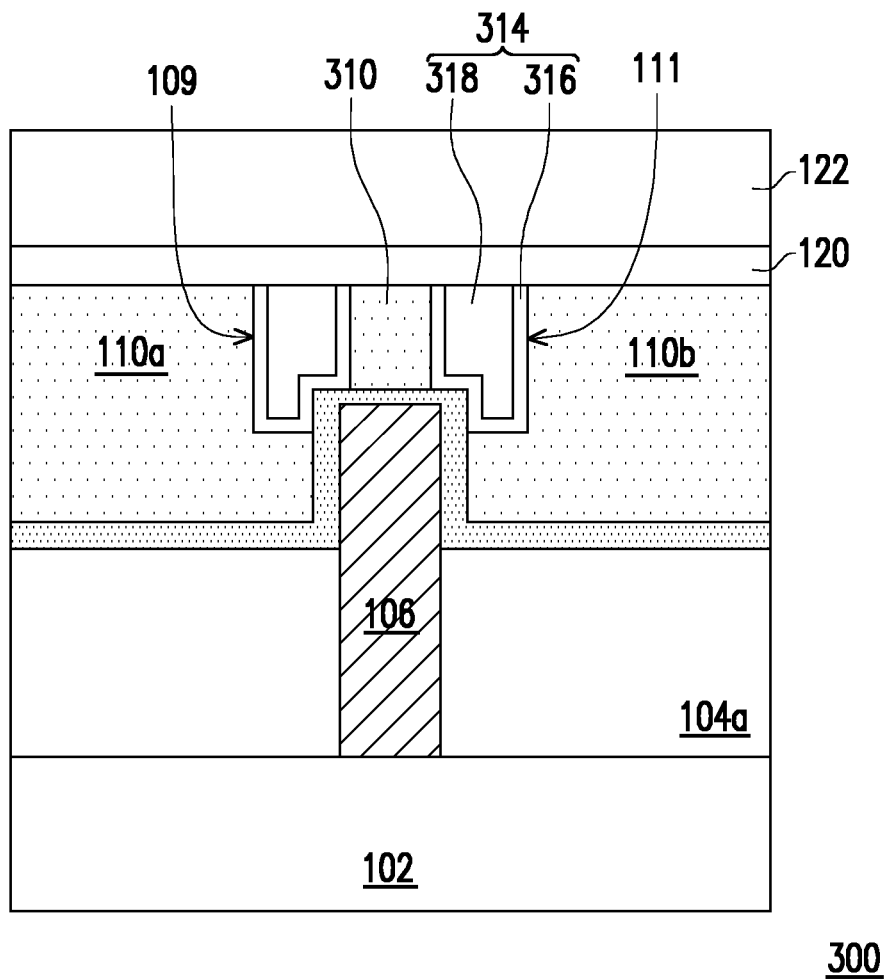
FIG. 4 is a schematic cross-sectional view of a RRAM according to a third embodiment of the invention.

FIG. 4 is a schematic cross-sectional view of a RRAM according to a third embodiment of the invention.

Referring to FIG. 4, a RRAM 300 of the third embodiment of the present invention is similar to the RRAM 200 of the second embodiment, and the main difference is that: a first barrier layer 316 of the RRAM 300 of the third embodiment further extends to cover the sidewall of a third oxygen reservoir layer 310. In one embodiment, the third oxygen reservoir layer 310 may be formed by following steps: after forming the oxygen reservoir material layer 110 of FIG. 1D, a patterning process is performed to form two openings 109, 111 in the oxygen reservoir material layer 110; isolation structures 314 are then formed in the two openings 109, 111. Specifically, as shown in FIG. 4, the isolation structure 314 includes a first barrier layer 316 and an insulating layer 318. The first barrier layer 316 conformally covers the openings 109, 111. The insulating layer 318 is located on the first barrier layer 316 and fills up the openings 109 and 111. In the embodiment, the first oxygen reservoir layer 110a, the second oxygen reservoir layer 110b, and the third oxygen reservoir layer 310 are formed simultaneously. The isolation structure 314 separates the first oxygen reservoir layer 110a, the second oxygen reservoir layer 110b, and the third oxygen reservoir layer 310.

Based on above, in the embodiment of the present invention, the continuous oxygen storage material layer is divided into a multi-channel structure and the multi-channel structure shares the upper electrode to increase the current gain, thereby improving the performance of the RRAM. In addition, during the forming operation, the data storage layer with the thinner thickness has a lower forming voltage, which is beneficial to mass production and can improve the reliability of the RRAM. Further, the multi-channel structure of the embodiment of the present invention can effectively reduce the chip usage area, thereby achieving the requirement of miniaturization.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a resistive random access memory (RRAM), comprising:
   forming a lower electrode protruding from a top surface of a dielectric layer;
   conformally forming a data storage layer on the lower electrode and the dielectric layer;
   forming an oxygen reservoir material layer on the data storage layer;
   forming an opening in the oxygen reservoir material layer to expose the data storage layer on the lower electrode;
   forming an isolation structure in the opening, wherein the isolation structure divides the oxygen reservoir material layer into a first oxygen reservoir layer and a second oxygen reservoir layer; and forming an upper electrode on the first and second oxygen reservoir layers, wherein the first and second oxygen reservoir layers share the upper electrode.

2. The method of manufacturing the RRAM according to claim 1, wherein the forming the opening in the oxygen reservoir material layer comprises:

conformally forming a first barrier layer in the opening;

forming an insulating material on the first barrier layer to fill up the opening; and performing a planarization process to expose a top surface of the first oxygen reservoir layer and a top surface of the second oxygen reservoir layer.

3. The method of manufacturing the RRAM according to claim 2, further comprising forming a third oxygen reservoir layer in the isolation structure, wherein the first barrier layer further extends to cover a sidewall of the third oxygen reservoir layer.

4. The method of manufacturing the RRAM according to claim 1, further comprising forming a second barrier layer on the isolation structure, the first oxygen reservoir layer, and the second oxygen reservoir layer, before the forming the upper electrode.

5. The method of manufacturing the RRAM according to claim 1, further comprising forming a third oxygen reservoir layer in the isolation structure, wherein the isolation structure separates the first, second, and third oxygen reservoir layers.

6. The method of manufacturing the RRAM according to claim 5, wherein the third oxygen reservoir layer is in contact with the data storage layer.

7. The method of manufacturing the RRAM according to claim 1, wherein the isolation structure covers a top surface of the lower electrode and extends to cover an upper sidewall of the lower electrode.

8. The method of manufacturing the RRAM according to claim 1, wherein the data storage layer covering a top surface of the lower electrode has a first thickness, the data storage layer covering the top surface of the dielectric layer has a second thickness, and the first thickness is less than the second thickness.

9. The method of manufacturing the RRAM according to claim 1, wherein a top surface of the isolation structure, a top surface of the first oxygen reservoir layer, and a top surface of the second oxygen reservoir layer are coplanar.

10. The method of manufacturing the RRAM according to claim 1, wherein a material of the data storage layer comprises at least one oxide material selected from the group consisting of $TiO_2$, $NiO$, $HfO$, $HfO_2$, $ZrO$, $ZrO_2$, $Ta_2O_5$, $ZnO$, $WO_3$, $CoO$, and $Nb_2O_5$.

* * * * *